(12) United States Patent
Kijima et al.

(10) Patent No.: US 7,678,241 B2
(45) Date of Patent: Mar. 16, 2010

(54) FILM FORMING APPARATUS, SUBSTRATE FOR FORMING OXIDE THIN FILM AND PRODUCTION METHOD THEREOF

(75) Inventors: Takeshi Kijima, Matsumoto (JP); Eiji Natori, Chino (JP); Mitsuhiro Suzuki, Tokyo (JP)

(73) Assignees: Seiko Epson Corporation, Tokyo (JP); Youtec Co., Ltd., Chiba-Ken (JP)

( * ) Notice: Subject to any disclaimer, the term of this patent is extended or adjusted under 35 U.S.C. 154(b) by 1047 days.

(21) Appl. No.: 11/071,116

(22) Filed: Mar. 4, 2005

(65) Prior Publication Data
US 2005/0148200 A1    Jul. 7, 2005

Related U.S. Application Data

(63) Continuation of application No. 10/376,594, filed on Mar. 3, 2003, now Pat. No. 6,913,675.

(51) Int. Cl.
*C23C 14/34* (2006.01)
(52) U.S. Cl. .............. 204/192.17; 204/192.15
(58) Field of Classification Search ............ 204/192.15, 204/192.17
See application file for complete search history.

(56) References Cited

U.S. PATENT DOCUMENTS

| | | | | |
|---|---|---|---|---|
| 2,886,502 | A * | 5/1959 | Holland | 204/192.12 |
| 5,055,169 | A * | 10/1991 | Hock et al. | 427/531 |
| 6,113,752 | A | 9/2000 | Hollstein | |
| 6,365,059 | B1 * | 4/2002 | Pechenik | 216/52 |
| 6,413,380 | B1 | 7/2002 | Pinarbasi | |
| 6,692,795 | B2 | 2/2004 | Won et al. | |

FOREIGN PATENT DOCUMENTS

| | | |
|---|---|---|
| JP | A 58-177463 | 10/1983 |
| JP | A 61-276964 | 12/1986 |
| JP | A 04-221061 | 8/1992 |
| JP | 05-287520 | * 11/1993 |
| JP | 06-207266 | * 7/1994 |
| JP | A 2002-231657 | 8/2002 |

* cited by examiner

*Primary Examiner*—Rodney G McDonald
(74) *Attorney, Agent, or Firm*—Oliff & Berridge PLC

(57) ABSTRACT

The invention provides a film forming apparatus that is capable of forming films sequentially with two types of film forming mechanisms in the same chamber. The film forming apparatus according to the present invention includes a Pt target disposed at one side within a film forming chamber, a sputtering output mechanism to supply to the Pt target, a Pt vapor deposition source disposed at an other side within the film forming chamber, a vapor deposition output mechanism to supply to the Pt vapor deposition source, a substrate holder disposed between the Pt target and the Pt vapor deposition source within the film forming chamber to mount a substrate, a rotating mechanism to move the substrate holder so that the substrate directs to the Pt target or to the Pt vapor deposition source, a heating mechanism to heat the substrate when the substrate is subjected to a sputtering film forming, and a cooling mechanism to cool the substrate when the substrate is subjected to vapor deposition film forming.

3 Claims, 4 Drawing Sheets

F I G. 1
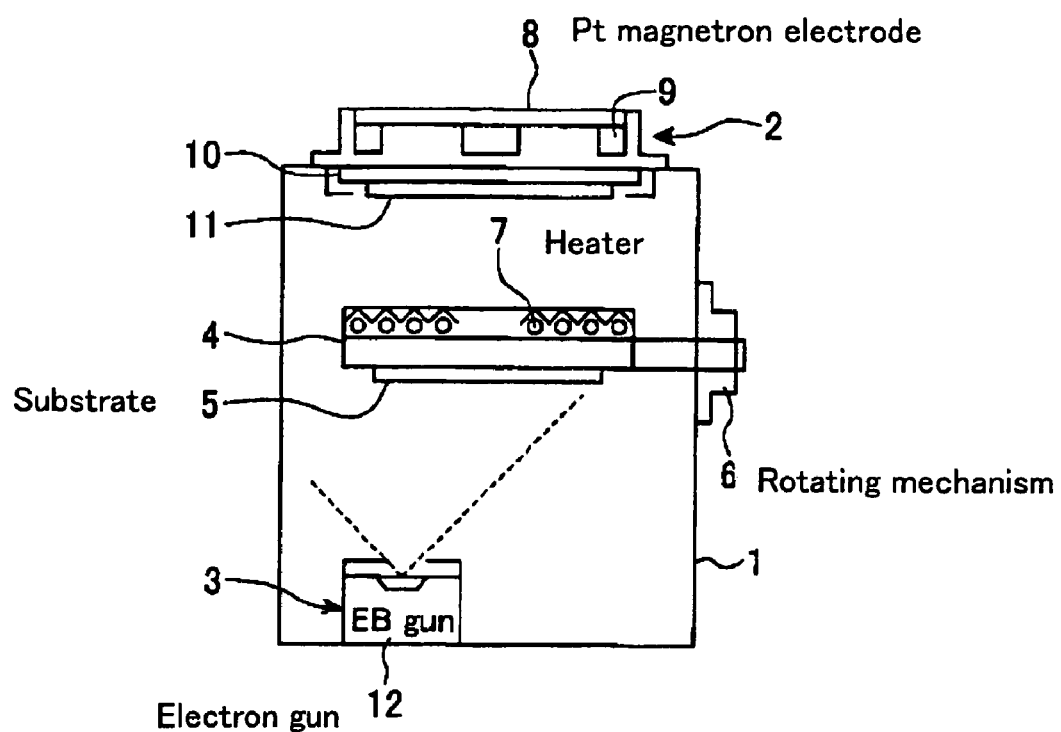

F I G. 3
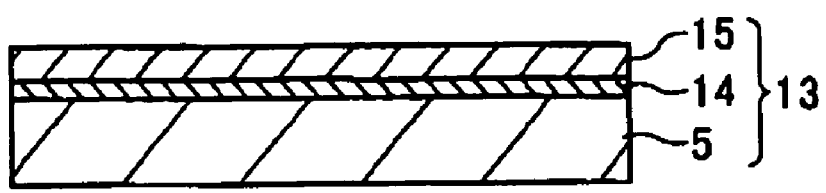

F I G. 4
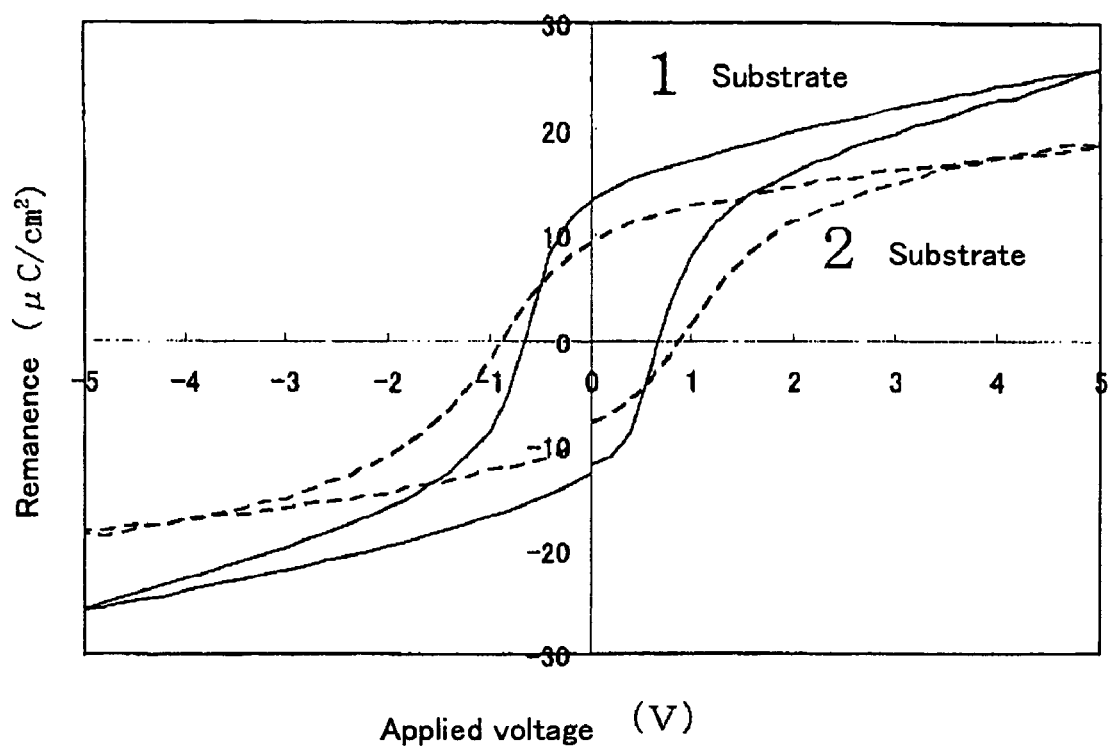

FILM FORMING APPARATUS, SUBSTRATE FOR FORMING OXIDE THIN FILM AND PRODUCTION METHOD THEREOF

This is a Continuation of application Ser. No. 10/376,594 filed Mar. 3, 2003. The entire disclosure of the prior application is hereby incorporated by reference herein in its entirety.

BACKGROUND OF THE INVENTION

The present invention relates to a film forming apparatus that is capable of forming films sequentially with two types of film forming mechanisms in the same chamber. The present invention also relates to a base substrate to form an oxide thin film thereon, that is a substrate to form the oxide thin film on which the oxide thin film having excellent properties and electrical properties can be easily formed, and to a production method thereof.

A related art magnetron sputtering apparatus is described below.

The magnetron sputtering apparatus produces high density plasma on a target by applying the magnetic field that intersects with the electric field to subject a trochoid movement to electrons emitted from a cathode. Thus, this sputtering apparatus has excellent power efficiencies that can enhance a sputtering speed at a relatively low voltage.

A related art ion beam sputtering apparatus is described below.

The ion beam sputtering apparatus forms a film at a low gas pressure by taking ion beams that are accelerated at high energy from an independent ion source, and by impinging the ion beams on a target under high vacuum atmosphere.

A related art electron beam heating vacuum vapor deposition apparatus is described below.

The electron beam heating vacuum vapor deposition apparatus irradiates a material to be evaporated with electron beams, heats it and evaporates it by utilizing an electron impact. In this method, a crucible is water-cooled. Therefore, impurities within a material of the crucible have low possibility to contaminate a vapor deposition film, and a material having a high melting point, a semiconductor or an oxide can be vapor deposited.

In the above-mentioned related art sputtering apparatuses and the vapor deposition apparatus, when a first thin film is formed on the substrate by sputtering, and a second thin film is formed on the first thin film to produce an oxide thin film forming substrate, the first thin film and the second thin film cannot be formed sequentially. In other words, the substrate is introduced into a chamber of the sputtering apparatus, the first thin film is formed on the substrate by sputtering, the substrate is then taken out from the chamber, the substrate is introduced into a chamber of the vapor deposition apparatus, and the second thin film is formed on the first thin film by a vapor deposition method. Accordingly, the first thin film and the second thin film cannot be formed sequentially within the same chamber.

As an example, a Pt substrate formed in a related art batch process is described below.

A metal Pt material can change its structure depending on a forming temperature. For example, when a Pt thin film is formed on a substrate at a temperature ranging from room temperature to not exceeding 300° C., a very flat Pt substrate is formed. However, such a substrate has poor crystallinity and orientation properties as compared with the one formed by heating at 300° C. or more. Accordingly, when an oxide thin film forming solution is used to form an oxide thin film by a spin coat method and the like on the flat Pt substrate on which the Pt thin film is formed at a temperature not exceeding 300° C., poor crystallinity and orientation properties of the Pt substrate may result in poor crystallinity and orientation properties of the oxide thin film thereon, although the thin film is very easily formed.

On the other hand, when a Pt thin film is formed on the substrate at a forming temperature ranging from 300° C. to 650° C., the Pt thin film has a distinct columnar structure and its crystallinity (orientation properties) is enhanced as the temperature increases. However, a gap will be produced between Pt columns. If an oxide thin film is formed on such a Pt substrate, the oxide thin film forming solution itself or oxide thin film constituent elements will be dispersed between the Pt columns, and a composition of the oxide thin film especially at an interface with the Pt substrate will have a distribution, although the oxide thin film can easily attain excellent crystallinity and orientation.

When the Pt thin film is formed on the substrate at 650° C. or more, the film is in a granulated structure. In this case, the Pt thin film will have a surface with a poor morphology and poor orientation properties. Correspondingly, the oxide thin film thereon cannot be excellently produced.

In addition, the following is commonly applied to all of the above-mentioned Pt substrates. When the Pt thin film is formed by the sputtering method, a mechanism is used such that an inert gas or the like is changed to be a high energy plasma, the Pt target is exposed to the plasma and energy of the plasma is transferred to a Pt element of the Pt target, whereby the Pt thin film is coated on the substrate. Accordingly, the thus-formed Pt substrate contains a great amount of the inert gas. Typically, an argon (Ar) gas is often used, which results in the Pt substrate on which a great amount of Ar is adsorbed. When the oxide thin film is formed on the Pt substrate, Ar is emitted from the Pt substrate to the oxide thin film in every thermal step. This might cause peeling at the interface, perforation or poor orientation properties.

SUMMARY OF THE INVENTION

The present invention addresses the above and/or other issues, and provides a film forming apparatus being capable of forming films sequentially with two types of film forming mechanisms in the same chamber. The present invention provides a substrate to form an oxide thin film, that is an oxide thin film forming substrate on which the oxide thin film having excellent properties can be easily formed. The invention also provides a production method thereof.

In order to address or solve the above, an apparatus to form a film according to the present invention is provided that includes: a film forming chamber, a substrate holder disposed within the film forming chamber to mount a substrate, a first film forming mechanism disposed within the film forming chamber to form a first electrode thin film on the substrate, and a second film forming mechanism disposed within the film forming chamber to form a second electrode thin film on the first electrode thin film.

An apparatus to form a film according to the present invention includes a film forming chamber, a substrate holder disposed within the film forming chamber to mount a substrate, a sputtering film forming mechanism disposed within the film forming chamber to form a first electrode thin film on the substrate by a sputtering, and a vapor deposition film forming mechanism disposed within the film forming chamber to form a second electrode thin film on the first electrode thin film by a vapor deposition method.

The above-mentioned film forming apparatuses include the sputtering film forming mechanism and the vapor deposition film forming mechanism, whereby the film can be formed by the sputtering and the vapor deposition method. Using the film forming apparatuses, the first electrode thin film is formed on the substrate by the sputtering film forming mechanism, and sequentially the second electrode thin film is formed on the first electrode thin film by the vapor deposition film forming mechanism. Thus, the oxide thin film forming substrate can be produced. The oxide thin film having excellent properties can be easily formed on the oxide thin film forming substrate.

In the film forming apparatus according to the present invention, the first electrode thin film can be one selected from the group of a Pt electrode thin film, an Ir electrode thin film and a Ru electrode thin film. The second electrode thin film can be one selected from the group of a Pt electrode thin film, an Ir electrode thin film and a Ru electrode thin film.

An apparatus to form a film according to the present invention includes an electrode target including of one of Pt, Ir and Ru disposed at one side within a film forming chamber, a sputtering output mechanism to supply to the electrode target, an electrode vapor deposition source including one of Pt, Ir and Ru disposed at the other side within the film forming chamber, a vapor deposition output mechanism to supply to the electrode vapor deposition source, a substrate holder disposed between the electrode target and the electrode vapor deposition source within the film forming chamber to mount a substrate, a driving mechanism to move the substrate holder so that the substrate directs to the electrode target or to the electrode vapor deposition source, a heating mechanism to heat the substrate when the substrate is subjected to a sputtering film forming, an oxidizing gas supplying mechanism to supply an oxidizing gas to the film forming chamber, and a cooling mechanism to cool the substrate when the substrate is subjected to a vapor deposition film forming.

The above-mentioned film forming apparatuses include the electrode target, the sputtering output mechanism, the electrode vapor deposition source and the vapor deposition output mechanism, whereby the film can be formed by the sputtering and the vapor deposition method. Using the film forming apparatuses, the first electrode thin film is formed on the substrate by the sputtering in the state that the substrate is heated to the predetermined temperature by the heating mechanism, the substrate is cooled to the predetermined temperature by the cooling mechanism and sequentially the second electrode thin film is formed on the first electrode thin film by the vapor deposition film forming mechanism. Thus, the oxide thin film forming substrate can be produced. The oxide thin film having excellent properties can be easily formed on the oxide thin film forming substrate.

A film forming apparatus according to the present invention includes an electrode target including one of Pt, Ir and Ru disposed at one side within a film forming chamber, a sputtering output mechanism to supply to the electrode target, an electrode vapor deposition source including one of Pt, Ir and Ru disposed at one side within the film forming chamber, a vapor deposition output mechanism to supply to the electrode vapor deposition source, a substrate holder disposed at the other side within the film forming chamber to mount a substrate, a heating mechanism to heat the substrate when the substrate is subjected to a sputtering film forming, an oxidizing gas supplying mechanism to supply an oxidizing gas to the film forming chamber, and a cooling mechanism to cool the substrate when the substrate is subjected to a vapor deposition film forming.

A method of producing an oxide thin film forming substrate according to the present invention includes forming a first electrode thin film including one of Pt, Ir and Ru on a substrate at a substrate temperature ranging from room temperature to 650° C. by sputtering, and forming a second electrode thin film including one of Pt, Ir and Ru on the first electrode thin film at substrate temperature not exceeding 350° C.

In the oxide thin film forming substrate formed by the above-mentioned production method, the second electrode thin film is sequentially vapor deposited at low temperature not exceeding 350° C. on the first electrode thin film having excellent crystallinity and orientation properties formed by the high temperature sputtering from room temperature to about 650° C., thereby providing a dense and flat oxide thin film forming substrate having excellent crystallinity and orientation properties. In addition, since a significant or major part of the oxide thin film forming substrate is a low temperature vapor deposited film and Ar gas is only a little or slightly contained in the film, the Ar gas is hardly liberated later. Consequently, the oxide thin film having excellent properties can be easily formed on the oxide thin film forming substrate.

An oxide thin film forming substrate according to the present invention includes a substrate, a first electrode thin film including one of Pt, Ir and Ru formed on the substrate, and a second electrode thin film including one of Pt, Ir and Ru formed on the first electrode thin film. The first electrode thin film is formed at a substrate temperature ranging from room temperature to 650° C. by sputtering. The second electrode thin film is formed at a substrate temperature not exceeding 300° C. by a vapor deposition method.

An oxide thin film forming substrate according to the present invention includes a substrate, a first electrode thin film including one of Pt, Ir and Ru formed on the substrate, and a second electrode thin film including one of Pt, Ir and Ru formed on the first electrode thin film. The first electrode thin film is formed at a substrate temperature ranging from room temperature to 650° C. by sputtering. The second electrode thin film is formed at a substrate temperature not exceeding 300° C. by a vapor deposition method. A film thickness of the first electrode thin film is 1/5 or less of a film thickness of the second electrode thin film.

According to the above-mentioned oxide thin film forming substrate, since a significant or major part of the electrode thin film is the second electrode thin film, the second electrode thin film is a low temperature vapor deposited film and Ar gas is only a little or slightly contained in the film, the Ar gas is hardly liberated later. Consequently, the oxide thin film having excellent properties can be easily formed on the oxide thin film forming substrate.

As described above, according to one aspect of the present invention, the same chamber includes two types of the film forming mechanisms. Accordingly, there can be provided the film forming apparatus being capable of forming films sequentially with two types of film forming mechanisms in the same chamber. According to the other aspect of the present invention, there can be provided a substrate to form an oxide thin film, that is an oxide thin film forming substrate on which the oxide thin film having excellent properties can be easily formed, and a production method thereof.

In other words, using the film forming apparatus including the two types of the film forming mechanisms within the same chamber, the second electrode thin film can be formed without taking out the substrate from the chamber after the first electrode thin film is formed. Since the first electrode thin film is not exposed to atmosphere, the surface of the first electrode thin film can be prevented from being contaminated or the contamination can be reduced. When the second electrode thin film is formed on the top of the first electrode thin film, the information, such as the crystallinity of the first electrode thin film, can be advantageously transmitted to the second electrode thin film.

BRIEF DESCRIPTION OF THE DRAWINGS

FIG. 1 is a schematic of the film forming apparatus according to a first exemplary embodiment of the present invention;

FIG. 3 is a sectional view of the oxide thin film forming substrate;

FIG. 4 is a graph showing ferroelectric hysteresis properties.

DETAILED DESCRIPTION OF PREFERRED EMBODIMENTS

Figure 2:
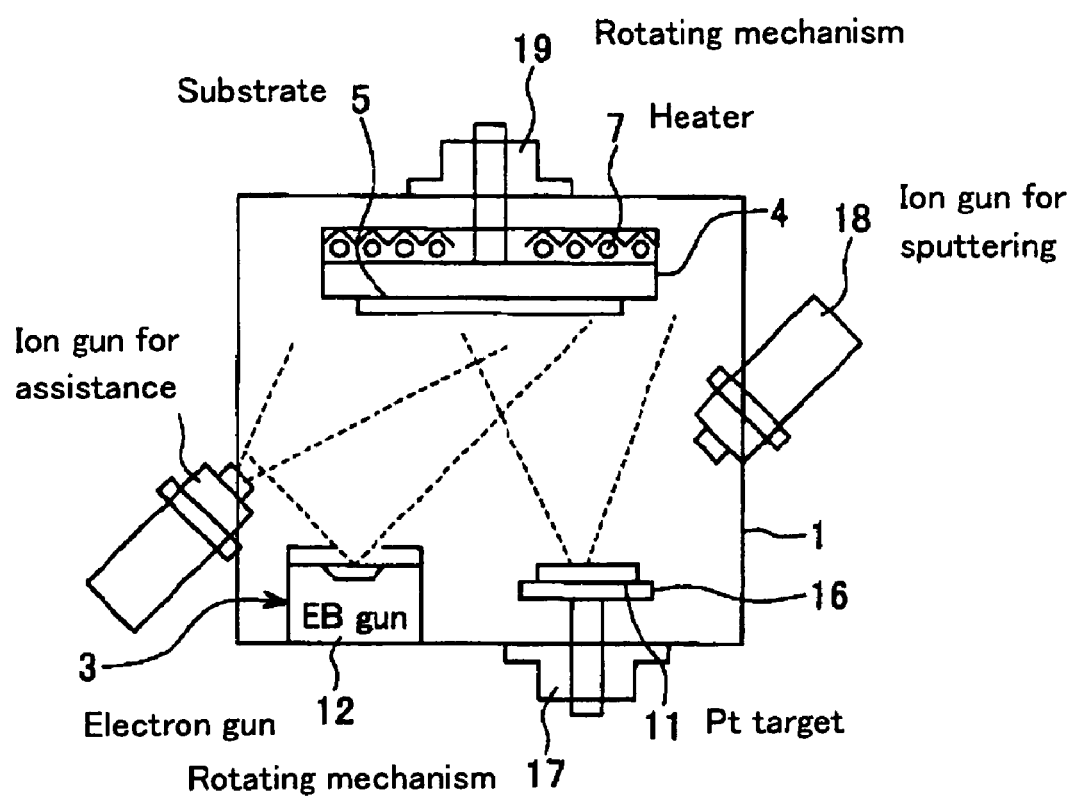
FIG. 2 is a schematic of the film forming apparatus according to a second exemplary embodiment of the present invention.

Exemplary embodiments of the present invention are described below referring to the figures.

FIG. 1 is a schematic of the film forming apparatus according to the first exemplary embodiment of the present invention. The film forming apparatus can form the film by the sputtering and the vapor deposition method.

As shown in FIG. 1, the film forming apparatus has a film forming chamber 1, and a Pt target electrode 2 is disposed at a top of the film forming chamber 1. At a bottom of the film forming chamber 1, a Pt vapor deposition source 3 is disposed, and in the vicinity of a center of the film forming chamber 1, a substrate holder 4 is disposed.

The Pt target electrode 2 includes a Pt magnetron electrode 8, magnets 9, a cathode electrode 10 and a Pt target 11. The Pt target 11 is disposed facing to the substrate holder 4. To the magnetron electrode 8, a high frequency power supply (RF power supply) or a direct power supply (DC power supply) is connected.

The Pt vapor deposition source 3 includes a crucible containing a Pt evaporation material and an electron gun (EB gun) 12. To the crucible, a cooling mechanism (not shown) is attached. The Pt vapor deposition source 3 irradiates the Pt evaporation material with electron beams from the electron gun 12, heating it and evaporating Pt.

The substrate holder 4 holds the substrate 5, and is attached to a rotating mechanism 6. The substrate holder 4 is rotated by the rotating mechanism 6 to face the substrate to the Pt target electrode 2 and the Pt vapor deposition source 3, respectively. The substrate holder 4 may also be rotated by any other rotating mechanism (not shown) in the state where it faces the Pt target electrode 2 and the Pt vapor deposition source 3, respectively. At a top (an opposite side of a mounting side of the substrate 5) of the substrate holder 4, a heater (an infrared ray lamp) 7 to heat the substrate is disposed. At a bottom surface (the mounting side of the substrate) of the substrate holder 4, a reflector (not shown) is disposed. The substrate holder 4 also includes a substrate cooling mechanism (not shown) to decrease a substrate temperature.

To the film forming chamber 1, a gas system (not shown) to supply a sputtering inert gas and an exhaust pump system (not shown) to decrease an internal pressure in the film forming chamber 1 to the predetermined pressure are connected.

A method of forming a thin film on a substrate using the film forming apparatus shown in FIG. 1 is described below. A final product produced using the film forming apparatus is an oxide thin film forming substrate.

Firstly, the substrate 5 is mounted on the substrate holder 4 and the substrate holder 4 is rotated by the rotating mechanism 6 to face the substrate 5 to the Pt target 11. Then, the film forming chamber 1 is evacuated with the exhaust pump system so that the internal pressure in the film forming chamber 1 reaches the predetermined pressure (for example, about $1 \times 10^{-6}$ Torr). Then, an inert gas (for example, Ar) is supplied to the film forming chamber 1 from the gas system so that the internal pressure of the film forming chamber is maintained at the predetermined pressure (for example, about $1 \times 10^{-3}$ Torr to $1 \times 10^{-2}$ Torr).

The heater 7 is turned on to increase the substrate temperature to the predetermined temperature (room temperature to about 650° C., preferably about 600° C.) and the substrate is maintained at the temperature.

The Pt target 11 is powered to sputter a surface of the Pt target 11 with the inert gas. As a result, a first Pt thin film having a film thickness of about 5 to 10 nm is deposited on the surface of the substrate 5 facing to the Pt target 11. Specifically, once the cathode electrode 10 is powered via the Pt magnetron electrode 8 in the Pt target electrode 2 from the power source, discharge is produced between the cathode electrode 10 and the substrate 5 to form plasma. The magnets 9 form lines of magnetic force, whereby portions with high plasma density are formed near the surface of the Pt target. Sputter atoms sputtered from the Pt target 11 are deposited on the substrate 5 to form a film on the substrate 5. Thus, a first Pt thin film having a film thickness of about 5 to 10 nm is formed on the substrate 5.

Then, the power supply to the Pt target 11 is stopped to terminate the sputtering. The supply of the inert gas is also stopped. The infrared ray heater 7 is also turned off.

Thereafter, the substrate holder 4 is rotated by the rotating mechanism 6 to face the substrate 5 to the Pt vapor deposition source 3. The substrate 5 is cooled by the substrate cooling mechanism to decrease the substrate temperature to 30° C. or less.

The Pt vapor deposition source 3 is powered to evaporate Pt and to vapor deposit it on the substrate 5. Thus, a second Pt thin film having a film thickness of about 100 to 200 nm is deposited on the first Pt thin film. In order to enhance an in-plane film thickness distribution of the second Pt thin film, the substrate is rotated in-plane by the rotating mechanism. Specifically, while the substrate is rotated in-plane, the Pt evaporation material is irradiated with the electron beams by the electron gun 12 and is heated to evaporate Pt, whereby the second Pt thin film is formed on the first Pt thin film.

Then, the power supply to the Pt vapor deposition source 3 is stopped to terminate the vapor deposition. Thus, the oxide thin film forming substrate is produced.

FIG. 3 is a sectional view showing the oxide thin film forming substrate produced as described above.

An oxide thin film forming substrate 13 includes the substrate 5. On the substrate 5, a first Pt thin film 14 having a thickness of about 5 to 10 nm is formed by sputtering. On the first Pt thin film 14, a second Pt thin film 15 having a thickness of about 100 to 200 nm is formed by a vapor deposition method.

According to the first exemplary embodiment described above, using the film forming apparatus that can form the film by the sputtering and the vapor deposition method, the first Pt thin film 14 is formed on the substrate 5 by the sputtering, and sequentially the second Pt thin film 14 is formed on the first Pt thin film 14 by the vapor deposition method. Thus, the oxide thin film forming substrate 13 can be produced. The oxide thin film having excellent properties can be easily formed on the oxide thin film forming substrate 13.

For example, the Pt coated substrate formed by the above-mentioned film forming apparatus is described. The Pt is sequentially vapor deposited at low temperature on the Pt coated substrate having excellent crystallinity and orientation properties formed by the high temperature sputtering, resulting in a dense and flat Pt coated substrate having excellent crystallinity and orientation properties. In addition, since a major part of the Pt coated substrate is a low temperature vapor deposited film and Ar gas is only a little or slightly contained in the film, the Ar gas is hardly liberated later.

The reason why the oxide thin film having excellent properties can be formed on the oxide thin film forming substrate 13 is demonstrated in a third exemplary embodiment.

Although the magnetron sputtering method is used in the above-mentioned first exemplary embodiment, any other sputtering methods including a DC sputtering method, an RF sputtering method and an ion beam sputtering method using a sputtering ion gun can be used.

Although the electron beam vapor deposition (EB vapor deposition) method utilizing the electron beam is used in the above-mentioned first exemplary embodiment, any other vapor deposition methods including a resistance heating method can be used.

Although the Pt target electrode 2 is disposed at the top within the film forming chamber 1 and the Pt vapor deposition source 3 is disposed at the bottom within the film forming chamber 1 in the above-mentioned first exemplary embodiment, the disposition is not limited thereto and any other dispositions can be used as long as they include the driving mechanism that moves the substrate so as to face the Pt target electrode or the Pt vapor deposition.

FIG. 2 is a schematic of the film forming apparatus according to the second exemplary embodiment of the present invention. The same parts as those in FIG. 1 are referenced with the same number, and only the different parts are described below.

At the bottom of the film forming chamber 1, the Pt target 11 is disposed, and the Pt target 11 is disposed at a target holder 16. The target holder 16 is constructed to be rotated by a rotating mechanism 17. In the film forming chamber 1, a sputtering ion gun 18 is disposed to power the Pt target 11. The sputtering ion gun 18 irradiates ion beams that are accelerated at high energy and impinges the ion beams on the Pt target 11 under high vacuum atmosphere.

At the bottom of the film forming chamber 1, the Pt vapor deposition source 3 is disposed. At a lower part of the film forming chamber 1, an ion gun for assistance 20 is disposed. The ion gun for assistance 20 irradiates the ion beams upon the vapor deposition to the substrate and assists the vapor deposition to the substrate.

At the top of the film forming chamber 1, the substrate holder 4 is disposed. The substrate holder 4 can be rotated by a rotating mechanism 19 in the state where it faces the Pt target 11 and the Pt vapor deposition source 3.

Then, a method of forming a film on a substrate using the film forming apparatus shown in FIG. 2 is described below.

Firstly, the substrate 5 is mounted on the substrate holder 4. Then, the film forming chamber 1 is evacuated with the exhaust pump system so that the internal pressure in the film forming chamber 1 reaches the predetermined pressure. An inert gas (for example, Ar) is supplied to the film forming chamber 1 from the gas system so that the internal pressure of the film forming chamber is maintained at the predetermined pressure.

The heater 7 is turned on to increase the substrate temperature to the predetermined temperature (preferably about 600° C.) and the substrate is maintained at the temperature.

The Pt target 11 is powered to sputter a surface of the Pt target 11 with the ion beams. As a result, a first Pt thin film having a film thickness of about 5 to 10 nm is deposited on the surface of the substrate 5 facing to the Pt target 11. Specifically, the ion beams that are accelerated at high energy are taken out from the sputtering ion gun 18 and are impinged on the Pt target 11 to form a first Pt film on the substrate.

Then, the power supply to the Pt target 11 is stopped to terminate the sputtering. The supply of the inert gas is also stopped. The infrared ray heater 7 is also turned off.

Thereafter, the substrate 5 is cooled by the substrate cooling mechanism to decrease the substrate temperature to 200° C. or less.

The Pt vapor deposition source 3 is powered to evaporate Pt and to vapor deposit it on the substrate 5. Thus, a second Pt thin film having a film thickness of about 100 to 200 nm is deposited on the first Pt thin film. In order to enhance an in-plane film thickness distribution of the second Pt thin film, the substrate 5 is rotated in-plane by the rotating mechanism 19. Specifically, while the substrate 5 is rotated in-plane, the Pt evaporation material is irradiated with the electron beams by the electron gun 12 and is heated to evaporate Pt, whereby the second Pt thin film is formed on the first Pt thin film. At this time, the ion beams for assistance are irradiated by the ion gun for assistance, thereby assisting the film formation of the second Pt thin film.

Then, the power supply to the Pt vapor deposition source 3 is stopped to terminate the vapor deposition. Thus, the oxide thin film forming substrate is produced. Thus-produced oxide thin film forming substrate is the same as shown in FIG. 3.

In the above-mentioned second exemplary embodiment, the same advantages as the first exemplary embodiment can be provided.

In the above-mentioned second exemplary embodiment, although the ion beam sputtering method is used, any other sputtering methods can be used.

In the above-mentioned second exemplary embodiment, although the electron beam vapor deposition (EB vapor deposition) method utilizing the electron beam is used, any other vapor deposition methods can be used.

The third exemplary embodiment is described below.

Using the apparatus comprising the sputtering film forming mechanisms and the vapor deposition film forming mechanism according to the present invention used in the first exemplary embodiment, the following three oxide thin film forming substrates were produced.

(1) Pt (190 nm, formed at room temperature)/Pt (10 nm, formed at 600° C.)/SiO$_2$ (200 nm)/Si substrate according to the present invention (2) Pt (200 nm)/Ti (20 nm)/SiO$_2$ (200 nm)/Si substrate produced in the related art at room temperature; and (3) Pt (200 nm)/Ti (20 nm)/SiO$_2$ (200 nm)/Si substrate produced in the related art at 600° C.

The crystallinity and orientation properties of the Pt thin films formed were determined by X-ray diffraction. As a result, the substrates (1) and (3) had similar peak intensity of Pt (111). The substrate (2) had about ¾ peak intensity of that of the substrate (1) or (3). In addition, in the substrates (1) and (3), only the peak of Pt (111) was detected. However, in the substrate (2), the peak of Pt (200) was also detected at the same time. It can be concluded that the conventional Pt substrate (2) is poor as compared with the Pt substrate (1) according to the present invention and the related art Pt substrate (3).

Using the above-mentioned three substrates, the same ferroelectric thin films were formed on the top under the same film forming conditions. The film forming conditions were as follows:

| (Film forming conditions) | |
| --- | --- |
| Ferroelectric | $Bi_4Ti_3O_{12}$ |
| Film forming method | spin coat method |
| Number of revolutions | 4000 |
| Temporary firing temperature | 400° C. |
| Crystallization temperature | 650° C. |
| Film thickness | 100 nm |

After the above-mentioned ferroelectric thin films were formed on respective Pt coated oxide thin film forming substrates, and top Pt electrodes each having a diameter of 100 μmΦ and a film thickness of 100 nm were formed on the tops of the ferroelectric thin films at room temperature by the vapor deposition method, ferroelectric hysteresis properties were determined. As a result, the hysteresis properties were obtained as shown in FIG. 4.

Excellent ferroelectric properties were obtained only on the ferroelectric thin film of the substrate (1). The substrate (2) had about ¾ ferroelectric properties of those of the ferroelectric thin film of the substrate (1) as represented by remanence values. It was revealed that this corresponded to XRD peak intensity of the Pt electrode. In other words, the crystallinity and the orientation properties of the oxide thin film largely depend on the crystallinity and the orientation properties of the Pt electrode, which determine electric properties of the oxide thin film. The ferroelectric thin film on the substrate (3) had great leak current, and therefore no ferroelectric hysteresis could be detected. In the substrate (3), the Pt itself had excellent crystallinity and orientation properties similar to those of the substrate (1). However, the Pt electrode thin film was formed only at 600° C. and had a columnar structure with low density. In addition, it was revealed that a great amount of the argon (Ar) gas used in the sputtering was adsorbed on the Pt substrate, and it was released from the Pt upon the formation of the ferroelectric thin film. A number of holes were observed on the surface of the ferroelectric thin film. It is considered that the holes were formed by the above-mentioned fact. Accordingly, the ferroelectric thin film on the substrate (3) had great leak current, and therefore no ferroelectric hysteresis could be detected.

Advantages of the Pt coated substrate formed, for example, by the production method of the present invention are described below. The Pt coated substrate having excellent crystallinity and orientation properties is formed by the high temperature sputtering method, and Pt is sequentially vapor-deposited thereon at low temperature, whereby excellent crystallinity and orientation properties of the high temperature sputter Pt are also provided to the low temperature formed Pt. The low temperature formed Pt keeps an original dense and flat surface morphology. Accordingly, the dense and flat Pt coated substrate having excellent crystallinity and orientation properties can be formed. In addition, since a major part of the Pt coated substrate is a low temperature vapor deposited film and Ar gas is little contained in the film, liberation of the Ar gas after various thermal treatments can be advantageously reduced or prevented.

This invention is not to be unduly limited to the illustrative exemplary embodiments set forth herein, and various modifications and alterations can be made.

What is claimed:

1. A method of producing an oxide thin film forming substrate, comprising:
    forming a first electrode thin film including at least one of Pt, Ir and Ru on a substrate disposed on a substrate holder at a substrate temperature ranging from room temperature to 650° C. by sputtering from a sputtering source in a chamber;
    heating the substrate when the substrate is subjected to sputtering film forming;
    forming a second electrode thin film including at least one of Pt, Ir and Ru on the first electrode thin film at substrate temperature not exceeding 350° C. by vapor deposition from a vapor deposition source within the chamber, the sputtering source and the vapor deposition source positioned such that one of the sources is above the substrate and the other of the sources is below the substrate;
    rotating the substrate so that the substrate only faces one of the sources at a time in the chamber; and
    cooling the substrate when the substrate is subjected to vapor deposition film forming,
    wherein the step of rotating positions the substrate and the substrate holder such that the substrate holder provides line of sight visibility to only one of the deposition sources at a time.

2. A method of producing an oxide thin film forming substrate, comprising:
    forming a first electrode thin film including at least one of Pt, Ir and Ru on a substrate disposed on a substrate holder at a substrate temperature ranging from room temperature to 650° C. by sputtering from a sputtering source;
    heating the substrate when the substrate is subjected to sputtering film forming;
    forming a second electrode thin film including at least one of Pt, Ir and Ru on the first electrode thin film at substrate temperature not exceeding 350° C. by vapor deposition from a vapor deposition source, the sputtering source and the vapor deposition source positioned such that one of the sources is above the substrate and the other of the sources is below the substrate;
    cooling the substrate when the substrate is subjected to vapor deposition film forming; and
    rotating the substrate to sequentially perform the step of forming the first electrode thin film and the step of forming the second electrode thin film and so that the substrate only faces one of the sources at a time in the chamber,
    wherein the step of rotating positions the substrate and the substrate holder such that the substrate holder provides line of sight visibility to only one of the deposition sources at a time.

3. The method of claim 2, wherein the step of rotating rotates the substrate in the plane of the substrate.

* * * * *